(12) United States Patent
Yang (10) Patent No.: US 6,783,905 B2
(45) Date of Patent: Aug. 31, 2004

(54) ELECTRON BEAM EXPOSURE METHOD USING VARIABLE BACKWARD SCATTERING COEFFICIENT AND COMPUTER-READABLE RECORDING MEDIUM HAVING THEREOF

(75) Inventor: Seung-hune Yang, Youngin (KR)

(73) Assignee: Samsung Electronics Co., Ltd. (KR)

( * ) Notice: Subject to any disclaimer, the term of this patent is extended or adjusted under 35 U.S.C. 154(b) by 116 days.

(21) Appl. No.: 10/192,066

(22) Filed: Jul. 10, 2002

(65) Prior Publication Data

US 2003/0124442 A1 Jul. 3, 2003

(30) Foreign Application Priority Data

Dec. 27, 2001 (KR) ........................................ 2001-86151

(51) Int. Cl.$^7$ .............................. G03C 5/00; G03F 9/00
(52) U.S. Cl. ......................... 430/30; 430/296; 430/942
(58) Field of Search ........................... 430/30, 296, 942

(56) References Cited

U.S. PATENT DOCUMENTS 6,035,113 A * 3/2000 Gerber et al. ................ 716/19
6,051,347 A * 4/2000 Tzu et al. ..................... 430/30

FOREIGN PATENT DOCUMENTS

JP 7078737 3/1995

\* cited by examiner

*Primary Examiner*—Christopher G. Young
(74) *Attorney, Agent, or Firm*—F. Chau & Associates LLC (57) ABSTRACT

An electron beam exposure method is disclosed. First, An exposure region is divided into a plurality of grating regions. A pattern density is obtained for one of the plurality of grating regions. A backward scattering coefficient is determined in accordance with the pattern density for the one of the plurality of grating regions. An exposure dose amount is calculated from the backward scattering coefficient. The one of the plurality of grating regions is exposed with the calculated exposure dose amount. The backward scattering coefficient is provided with a variable function proportional to the pattern density. The backward scattering coefficient $\eta$ is provided with a variable value depending on the pattern density and location of the one of the plurality of grating regions.

22 Claims, 7 Drawing Sheets

ELECTRON BEAM EXPOSURE METHOD USING VARIABLE BACKWARD SCATTERING COEFFICIENT AND COMPUTER-READABLE RECORDING MEDIUM HAVING THEREOF

BACKGROUND OF THE INVENTION

1. Field of the Invention

The present invention relates to an electronic beam lithography and, more particularly, to a method and device for proximity effect correction of electronic beam exposure.

2. Description of the Related Art

Electron beam lithography is a technique used in forming a feature pattern on a material layer of a substrate. This entails the process of coating a material layer of a wafer with photoresist; writing a desired pattern onto the material layer by projecting an electron beam (referred to in the art as an "exposure"); developing the electron beam resist; and etching the resist material layer and leaving the desired pattern on the wafer. Electron beam lithography is commonly used to form a predetermined material layer pattern, forming an integrated circuit on the substrate. Similarly, electron beam lithography is also used to fabricate a photomask.

During electron beam exposure, proximity effect due to scattered electrons in a resist layer and a substrate considerably affects the accuracy of a pattern line width. Thus, the proximity effect is generally corrected by a compensation method. To estimate a value of the proximity effect, energy distribution accumulated in the resist layer can be represented as:

$$f(r) = \frac{1}{\pi(1+\eta)}\left[\frac{1}{\alpha^2}\exp\left(\frac{-r^2}{\alpha^2}\right) + \frac{\eta}{\beta^2}\exp\left(\frac{-r^2}{\beta^2}\right)\right] \quad \text{[Equation 1]}$$

wherein r is a distance between an electron incident point and an intensity calculation point, $\alpha$ is a parameter representing a forward scattering region, $\beta$ is a parameter representing a backward scattering region, and $\eta$ is a backward scattering coefficient, which is a ratio of an accumulated energy by backward scattering electrons and an accumulated energy by forward scattering electrons.

The backward scattering coefficient $\eta$ is a constant which is dependent on a material such as a substrate and a resist layer. Therefore, the backward scattering coefficient $\eta$ is a function of atomic weight, density, and thickness of an underlying material to be etched after exposure. If various pattern shapes having a same design critical dimension(CD) are formed, CD distribution can be varied with respective pattern densities. Therefore, if the proximity effect correction depends on a constant backward scattering coefficient $\eta$, the design of a highly integrated semiconductor device having a uniform pattern dimension can be difficult.

Furthermore, the electron beam does not expose only the desired portion of the resist layer, as the electron beam is reflected on a surface of an opaque film (which is formed between the resist layer and the substrate) or scattered by collisions with atoms of a resist material in the resist layer. Also, the electron beam is reflected in the electron beam resist and at the lower plane of an objective lens of an electron beam writer and, as a sequence, the electron beam exposes an undesired portion of the resist layer. The pattern dimension variation caused by the former additional exposure is referred to as a proximity effect. The pattern dimension variation caused by the latter additional exposure is referred to as a re-scattering effect or a fogging effect of the electron beam, and the pattern dimension variation caused by a pattern density is referred to as a loading effect.

Although numerous prior art methods for reducing the fogging effect and the loading effect have been proposed, there is a limitation to finely correct the pattern dimension variation for manufacturing highly integrated circuits. This is largely due to the fogging effect and the loading effect being correlated after assuming the backward scattering coefficient $\eta$ as a constant.

Therefore, it is highly desirable to provide a method and recordable medium for controlling an electron beam for compensation of variation of line width by the fogging effect and the loading effect.

SUMMARY OF THE INVENTION

An electron beam exposure method is provided, which includes the steps of: dividing an exposure region into a plurality of grating regions; obtaining a pattern density for one of the plurality of grating regions; determining a backward scattering coefficient in accordance with the pattern density for the one of the plurality of grating regions; calculating an exposure dose amount from the backward scattering coefficient; and exposing the one of the plurality of grating regions with the calculated exposure dose amount.

According to an embodiment of the present invention, the backward scattering coefficient is provided with a variable function proportional to the pattern density. The backward scattering coefficient is provided with a variable value depending on the pattern density and location of the one of the plurality of grating regions. The plurality of grating regions include a first grating region having a patterning region having a first backward scattering coefficient and a second grating region having a surrounding region not including the patterning region and a second backward scattering coefficient, wherein the second backward scattering coefficient is higher than the first backward scattering coefficient.

An electron beam exposure method is also provided, which includes the steps of: dividing an exposure region into a plurality of grating regions; obtaining respective pattern densities for the plurality of grating regions; generating a pattern map with locations of the exposure region in accordance with the pattern densities in the respective plurality of grating regions; determining backward scattering coefficients for the plurality of grating regions in accordance with the respective pattern densities and the locations of the exposure region; generating a backward scattering coefficient map with the locations of the exposure region in accordance with the backward scattering coefficients; calculating an exposure dose amount for the plurality of grating regions in accordance with the backward scattering coefficients obtained from the backward scattering coefficient map; and exposing the plurality of grating regions with the calculated exposure dose amount.

According to an embodiment of the present invention, the backward scattering coefficients are provided with a variable function proportional to the pattern densities. The backward scattering coefficients are provided with variable values depending on the pattern densities and the locations of the grating regions. The plurality of grating regions include a first grating region having a patterning region having a first backward scattering coefficient and a second grating region having a surrounding region not including the pattern region and a second backward scattering coefficient, wherein the second backward scattering coefficient is higher than the first backward scattering coefficient of the first grating region. The step of the calculating the exposure dose amount includes the following equation:

$$D(d_r) = \frac{1+2\eta}{1+2d_r\eta} \cdot D(1)$$

wherein $D(d_r)$ is the exposure dose amount, $\eta$ is the backward scattering coefficient, $d_r$ is a pattern density at a predetermined location, $0 \leq d_r \leq 1$, $D(1)$ is an exposure dose amount having the pattern density of 100%. The step of the calculating the exposure dose amount comprises the steps of: calculating an exposure dose amount by following equation:

$$D(d_r) = \frac{1+2\eta}{1+2d_r\eta} \cdot D(1)$$

wherein $D(d_r)$ is the exposure dose amount, $\eta$ is the backward scattering coefficient, $d_r$ is a pattern density at a predetermined location, $0 \leq d_r \leq 1$, $D(1)$ is an exposure dose amount having the pattern density of 100%; and obtaining a corrected dose amount by subtracting an increased dose amount $\Delta D(d_r)$ at the predetermined location from the exposure dose amount $D(d_r)$. The increased dose amount $\Delta D(d_r)$ is obtained by a variation of the backward scattering coefficient at the predetermined location of the grating region, when the backward scattering coefficient is increased from $\eta_1$ to $\eta_2$, the increased dose amount $\Delta D(d_r)$ is obtained by following equation:

$$\Delta D(d_r) = \frac{2(1-d_r)(\eta_2-\eta_1)}{(1+2d_r\eta_1)(1+2d_r\eta_2)} \cdot D(1)$$

wherein $d_r$ is a pattern density at the predetermined location, $0 \leq d_r \leq 1$, $D(1)$ is an exposure dose amount having the pattern density of 100%.

A recording medium having stored modules with instructions executable by a computer to perform a corrected electron beam exposure is also provided, the recording medium includes: a first program module for obtaining a pattern density in one grating region produced by dividing an exposure surface into a plurality of grating regions; a second program module for obtaining a backward scattering coefficient $\eta$ at the one grating region in accordance with the pattern density; and a third program module for obtaining an exposure dose amount from the backward scattering coefficient.

According to an embodiment of the present invention, the second program module includes a sub-program module for deciding the backward scattering coefficient $\eta$ in accordance with a predetermined function in which the backward scattering coefficient $\eta$ is proportional to the pattern density. The second program module includes a sub-program module for deciding the backward scattering coefficient $\eta$, the backward scattering coefficient $\eta$ is variable in accordance with the pattern density and a location of the grating region. The plurality of grating regions includes a first grating region having a patterning region having a first backward scattering coefficient and a second grating region having a surrounding region not including the patterning region having a second backward scattering coefficient, the second program module includes a sub-program module in which the second backward scattering coefficient is higher than the first backward scattering coefficient.

A recording medium having stored programs executable by a computer for performing a corrected electron beam exposure is also provided, the recording medium includes: a first program module for obtaining pattern densities of a plurality of grating regions divided by an exposure surface; a second program module for obtaining a pattern density map with locations of the plurality of grating regions in accordance with the pattern densities; a third program module for obtaining backward scattering coefficients at the plurality of grating regions in accordance with the pattern density and the location of exposure region; a fourth program module for generating a backward scattering coefficient map in accordance with the backward scattering coefficients; and a fifth program module for obtaining a corrected expose dose amount at one of the plurality of grating regions in accordance with the backward scattering coefficient.

According to an embodiment of the present invention, the third program module includes a sub-program module in which the backward scattering coefficient is provided with a variable function proportional to the pattern density. The third program module includes a sub-program module in which the backward scattering coefficient is provided with a variable value depending on the pattern density and the location of the grating region. The plurality of grating regions includes a first grating region having a patterning region having a first backward scattering coefficient and a second grating region having a surrounding region not including the patterning region and a second backward scattering coefficient, wherein the second program module includes a sub-program module in which the first backward scattering coefficient is higher than the second backward scattering coefficient. The fifth program module includes a sub-program module for calculating an exposure dose amount by following equation:

$$D(d_r) = \frac{1+2\eta}{1+2d_r\eta} \cdot D(1)$$

wherein $D(d_r)$ is the exposure dose amount, $\eta$ is the backward scattering coefficient, dr is a pattern density at a predetermined location, $0 \leq d_r < 1$, $D(1)$ is an exposure dose amount having the pattern density of 100%. The fifth program module includes: a first sub-program module for calculating an exposure dose amount by following equation:

$$D(d_r) = \frac{1+2\eta}{1+2d_r\eta} \cdot D(1)$$

wherein $D(d_r)$ is the exposure dose amount, $\eta$ is the backward scattering coefficient, $d_r$ is a pattern density at a predetermined location, $0 \leq d_r \leq 1$, $D(1)$ is an exposure dose amount having the pattern density of 100%; and a second sub-program module for obtaining a corrected dose amount by subtracting an increased dose amount $\Delta D(d_r)$ at a predetermined location from the exposure dose amount $D(d_r)$. The increased dose amount $\Delta D(d_r)$ is obtained by a variation of the backward scattering coefficient at a predetermined location of the grating region, when the backward scattering coefficient is increased from $\eta_1$ to $\eta_2$, the increased dose amount $\Delta D(d_r)$ is obtained by following equation:

$$\Delta D(d_r) = \frac{2(1-d_r)(\eta_2-\eta_1)}{(1+2d_r\eta_1)(1+2d_r\eta_2)} \cdot D(1)$$

wherein $d_r$ is a pattern density at the predetermined location, $0 \leq d_r < 1$, $D(1)$ is an exposure dose amount having the pattern density of 100%.

BRIEF DESCRIPTION OF THE DRAWINGS

The above and other objects and advantages of the present invention will become more apparent by describing in detail preferred embodiments thereof with reference to the accompanying drawings in which.

DETAILED DESCRIPTION OF PREFERRED EMBODIMENTS

Hereinafter, the present invention will be described in detail with reference to the accompany drawings. It should be noted that like reference numerals are used for designation of like or equivalent parts or portion for simplicity of illustration and explanation. Also, in the following description, specifications will be made to provide a thorough understanding about the present invention. It is apparent to one skilled in the art that the present invention can be achieved without the specifications. There will be omission of detailed description about well known functions and structures to clarify key points of the present invention.

Figure 1:
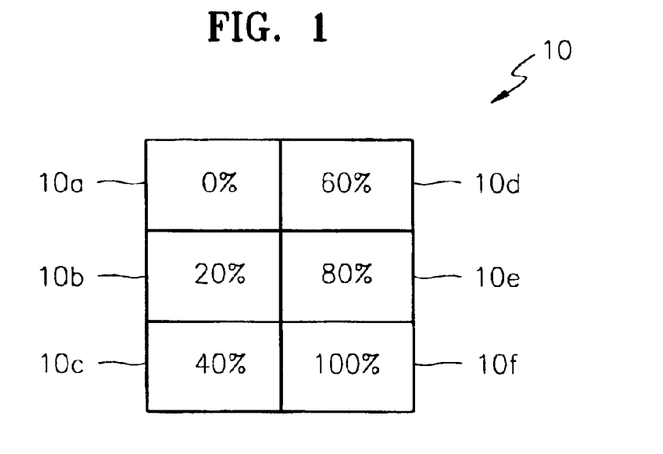
FIG. 1 is an exemplary pattern density map 10 for illustrating a relationship between a pattern density and a backward scattering coefficient η according to an embodiment of the present invention.

FIG. 1 is an exemplary pattern density map 10 for illustrating a relationship between a pattern density and a backward scattering coefficient η. The pattern density map 10 includes a plurality of grating regions 10a, 10b, 10c, 10d, 10e, and 10f having sizes of several mm (millimeter) to several tens mm. The plurality of grating regions 10a, 10b, 10c, 10d, 10e, and 10f have global pattern densities of 0%, 20%, 40%, 60%, 80%, and 100%, respectively.

Figure 2:
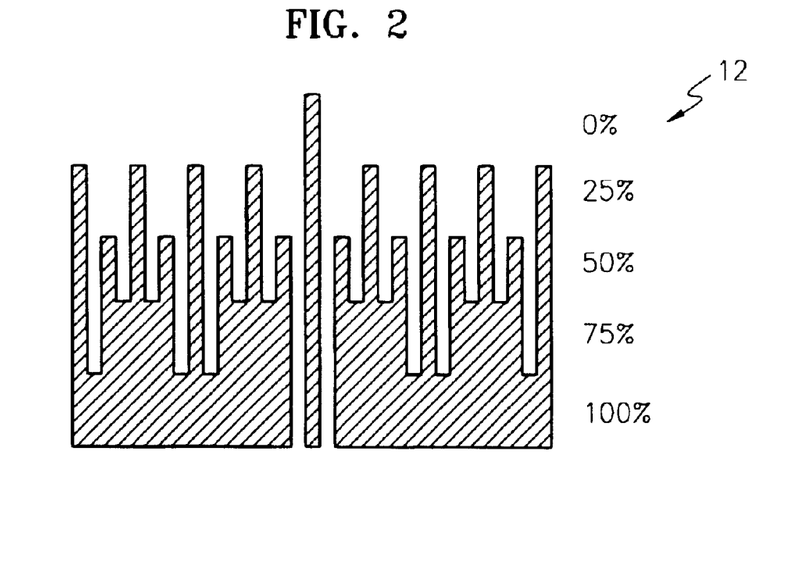
FIG. 2 is a fine repeating pattern in each of the plurality of grating regions of FIG. 1.

FIG. 2 is a part of a fine repeating pattern 12 in each of the plurality of grating regions 10a, 10b, 10c, 10d, 10e, and 10f of FIG. 1. Referring to FIG. 2, the fine repeating pattern 12 has pattern densities of 0%, 25%, 50%, 75%, and 100% and the size of the fine repeating pattern 12 is about several $\mu$m (micrometer) to about several tens $\mu$m.

Figure 3A:
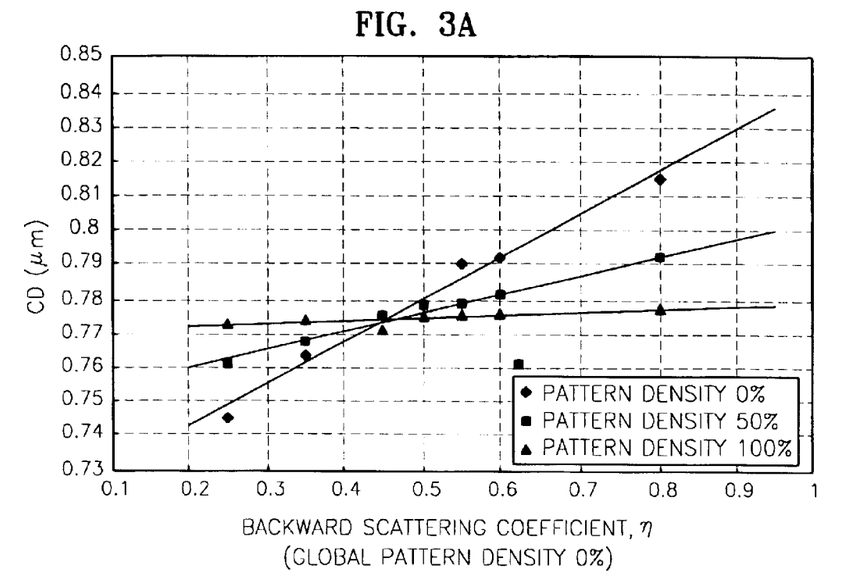
FIGS. 3A, 3B, and 3C are graphs for illustrating a simulation process to obtain a backward scattering coefficient η in an electronic beam exposure method according to an embodiment of the present invention.
Figure 3B:
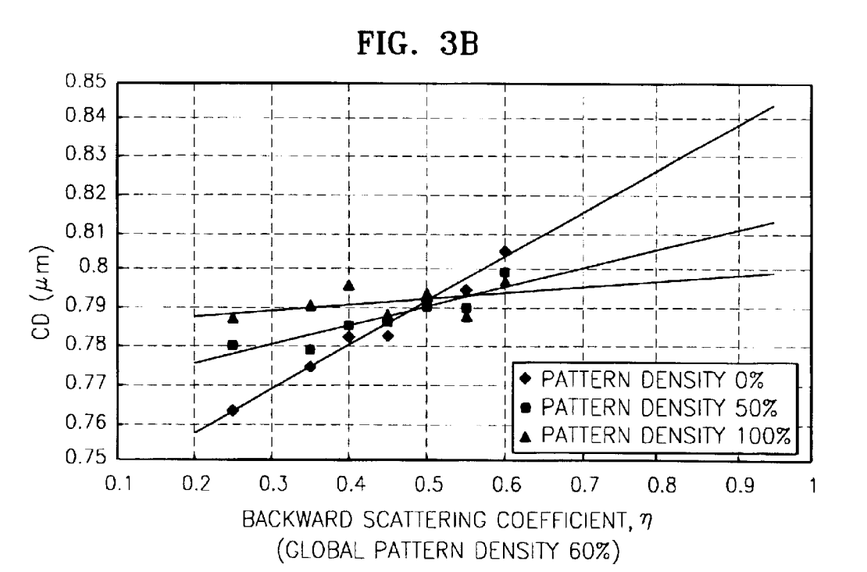
Figure 3C:
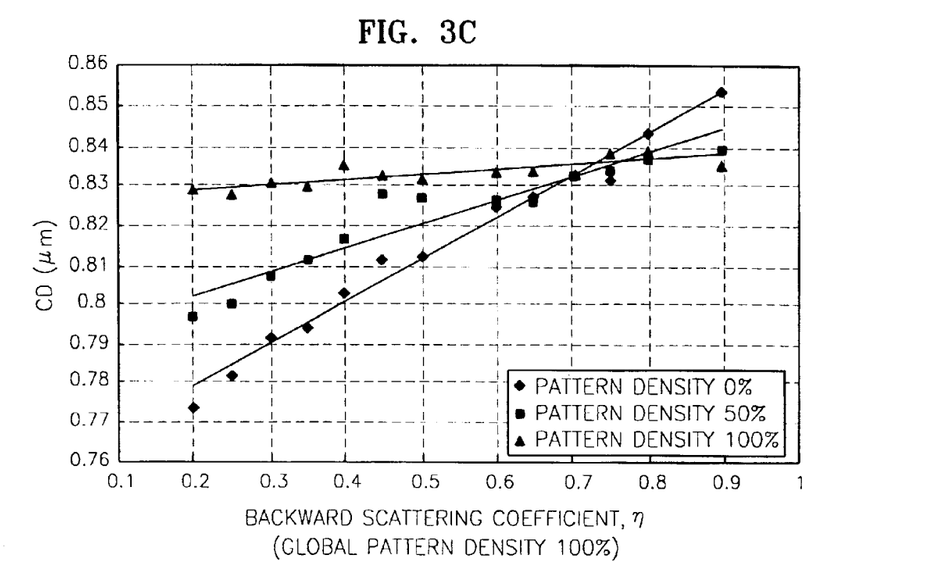

FIGS. 3A, 3B, and 3C are graphs for illustrating a simulation process to obtain a backward scattering coefficient η in the electronic beam exposure method according to an embodiment of the present invention.

For simplicity of the description, three grating regions 10a having 0% global pattern density, 10d having 60% global pattern density, and 10f having 100% global pattern density are selected. First, uniform CD distributions of the grating regions 10a, 10d, and 10f are obtained by a proper compensation exposure for the grating regions 10a, 10d, and 10f which is performed by controlling dose amount of the exposure. Since the grating region 10a having 0% global pattern density has a uniform CD distribution, the compensation exposure is not additionally performed. Next, CDs are plotted with backward scattering coefficients η for the pattern densities of 0%, 50%, and 100% after exposing various backward scattering coefficients η. Next, a backward scattering coefficient η is decided at the point which has similar value of the CD according to the pattern densities of 0%, 50%, and 100%. As shown in FIGS. 3A, 3B, and 3C, the backward scattering coefficient η of the grating region 10a having 0% global pattern density is about 0.45, the backward scattering coefficient η of the grating region 10d having 60% global pattern density is about 0.5, and the backward scattering coefficient η of the grating region 10f having 100% global pattern density is about 0.73. As shown in FIGS. 3A, 3B, and 3C, the backward scattering coefficients η are increased with increasing the global pattern densities.

Figure 4:
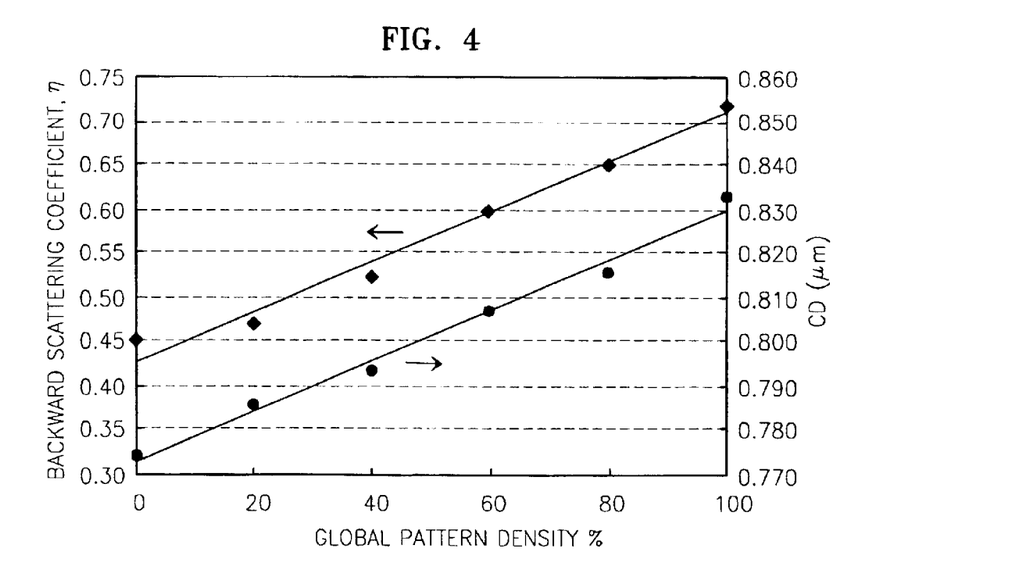
FIG. 4 is a graph showing backward scattering coefficients η and CDs are proportionally increased with pattern densities.

FIG. 4 is a graph showing the backward scattering coefficients η and CDs are proportionally increased with the global pattern densities. As shown in FIG. 4, the backward scattering coefficients η are not constant, but vary substantially linearly with the global pattern densities. Therefore, the backward scattering coefficients η are variable values as global pattern densities are changed to correctly compensate the proximity effect.

Figure 5:
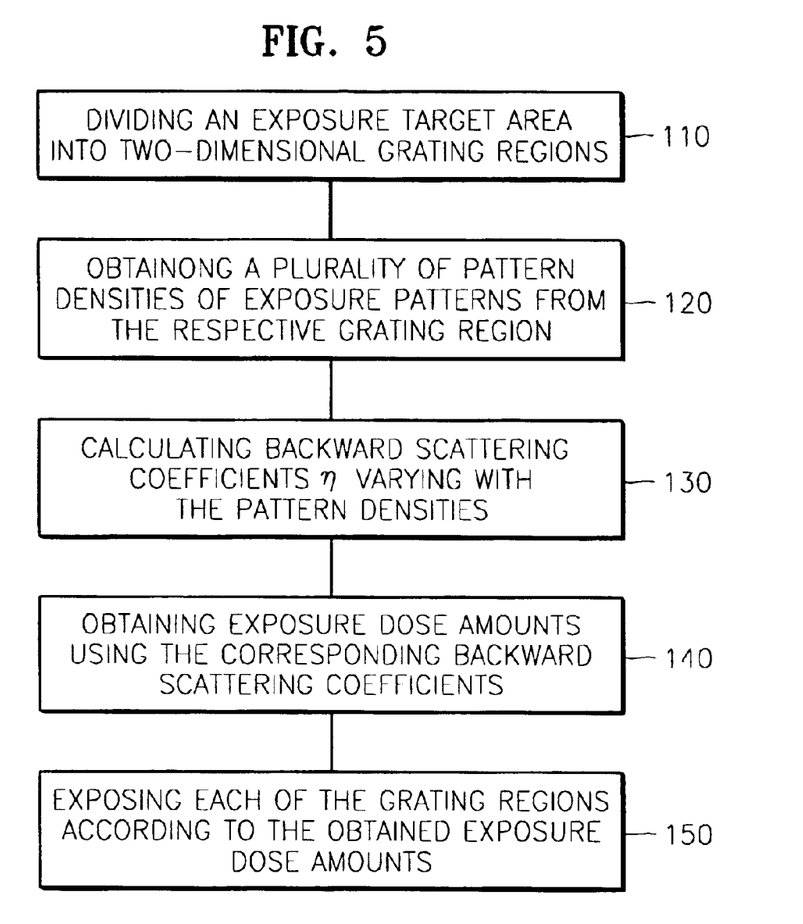
FIG. 5 is a flow chart for illustrating a method of electronic beam exposure according to an embodiment of the present invention.

FIG. 5 is a flow chart for illustrating an electronic beam exposure method according to an embodiment of the present invention.

Referring to FIG. 5, an exposure target area is divided into two-dimensional grating regions (Step 110). Next, a plurality of pattern densities $d_1, d_2, d_3, \ldots, d_n$ of exposure patterns are obtained from the respective grating regions (Step 120). Next, backward scattering coefficients η which are varied with the pattern densities $d_1, d_2, d_3, \ldots, d_n$ are calculated, preferably by simulation (Step 130). The relationship between the pattern densities $d_1, d_2, d_3, \ldots, d_n$ and the backward scattering coefficients η can be expressed as a mathematical equation linearly proportional to each other. Therefore, various backward scattering coefficients $\eta_1, \eta_2, \eta_3, \ldots, \eta_n$ can be obtained according to variable pattern densities $d_1, d_2, d_3, \ldots, d_n$. Next, exposure dose amounts $D(d_1), D(d_2), D(d_3) \ldots, D(d_n)$ are obtained using the corresponding backward scattering coefficients $\eta_1, \eta_2, \eta_3, \ldots, \eta_n$ (Step 140). Then, each of the grating regions is exposed according to the obtained exposure dose amounts $D(d_1), D(d_2), D(d_3), \ldots, D(d_n)$ (Step 150). According to an embodiment of the present invention, the various backward scattering coefficients $\eta_1, \eta_2, \eta_3, \ldots, \eta_n$ can be obtained according to variable pattern densities $d_1, d_2, d_3, \ldots, d_n$. Thus, line width variations of various patterns are corrected by properly changing the backward scattering coefficients $\eta_1, \eta_2, \eta_3, \ldots, \eta_n$ with the pattern densities $d_1, d_2, d_3, \ldots, d_n$.

Referring again to FIG. 4, when the backward scattering coefficients $\eta_1, \eta_2, \eta_3, \ldots, \eta_n$ are linearly increased with the pattern densities $d_1, d_2, d_3, \ldots, d_n$, the CDs are also linearly increased with the pattern densities $d_1, d_2, d_3, \ldots, d_n$. Thus, to correctly compensate the dose amount $D(d_1), D(d_2), D(d_3) \ldots, D(d_n)$, the loading effect as well as the fogging effect are also considered.

Figure 6:
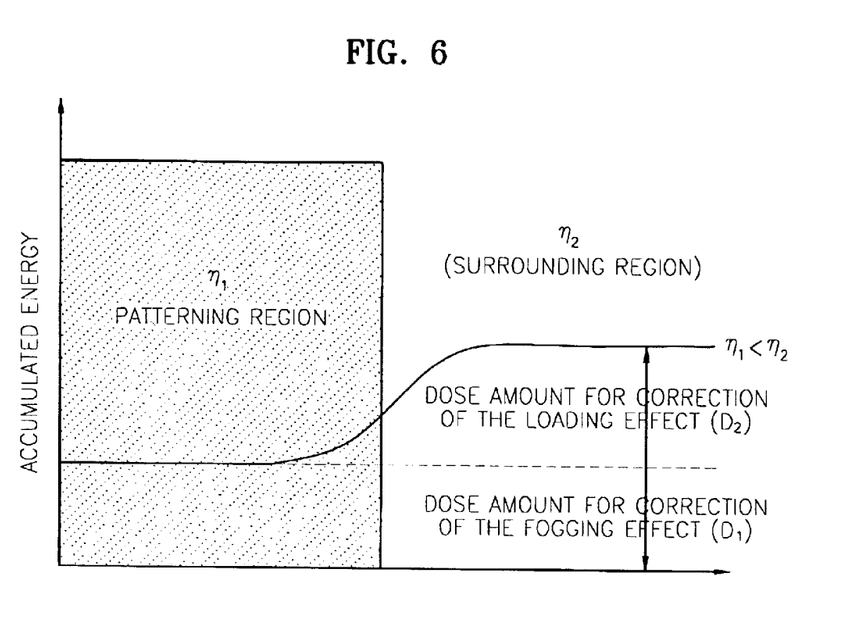
FIG. 6 is a graph showing an accumulated energy distribution in a patterning region and a surrounding region after an exposing process in case that a fogging effect and a loading effect are simultaneously considered.

FIG. 6 is a graph showing an accumulated energy distribution in a patterning region and a surrounding region when the fogging effect and the loading effect are simultaneously considered. Thus, in case that correction is performed by considering both the fogging effect and the loading effect, a first dose amount $D_1$ for correction of the fogging effect and a second dose amount $D_2$ for correction of the loading effect are needed for the surrounding region. In other words, the surrounding region needs more dose amount compared to the patterning region; therefore, the backward scattering coefficient $\eta_2$ of the surrounding region is higher than the backward scattering coefficient $\eta_1$ of the patterning region.

Figure 7:
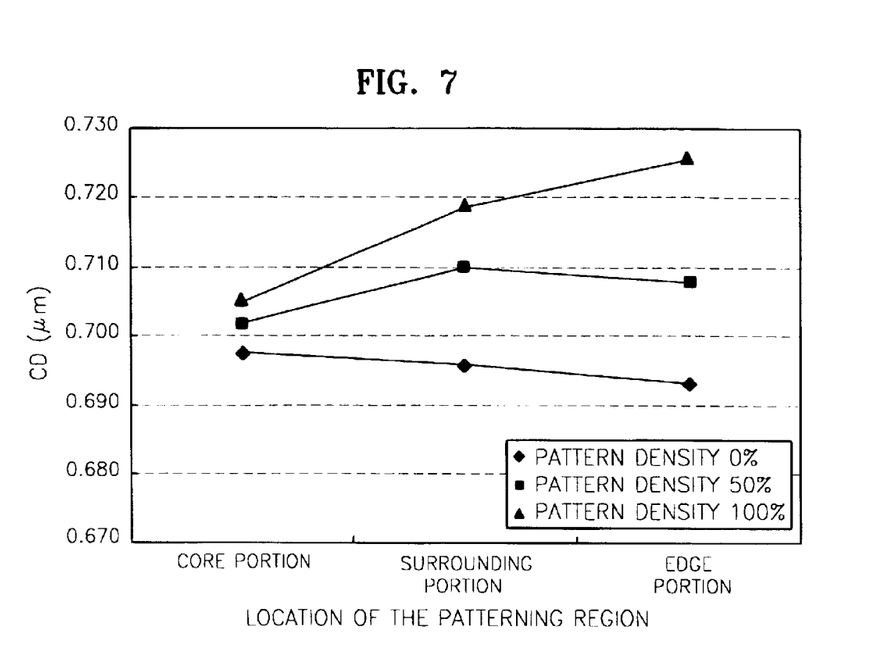
FIG. 7 is a graph for illustrating CD variations at a respective location of the patterning region in a mask.

FIG. 7 is a graph for illustrating CD variations at a respective location of the patterning region in a mask. Referring to FIG. 7, the CDs at a core portion of the patterning region are similar when pattern densities of the fine repeating pattern (shown in FIG. 2) are changed from 0% to 100%, however, the CDs at a surrounding portion and an edge portion are different when pattern densities of the fine repeating pattern are changed from 0% to 100%. Thus, the surrounding portion and edge portion of the patterning region require higher backward scattering coefficients. Therefore, as described above, the backward scattering coefficient $\eta$ is corrected according to the pattern density and the patterning region (or location) to finely and correctly form the desired line width.

According to an embodiment of the present invention, a line width in the exposure process is corrected using an electron beam, a variable backward scattering coefficient $\eta$ which is a function of the pattern density is prepared by using FIG. 4, or a backward scattering coefficient distribution map is prepared in an exposure region according to the function of the pattern density.

When the backward scattering coefficient $\eta$ is obtained by the function of the pattern density, an exposure dose amount $D(d_r)$ in a predetermined grating region is expressed as:

$$D(d_r) = \frac{1+2\eta}{1+2d_r\eta} \cdot D(1) \qquad \text{[Equation 2]}$$

wherein $0 \leq d_r \leq 1$, $D(1)$ is a dose amount in the grating region having a pattern density of 100%. As shown in Equation (2), as the backward scattering coefficient $\eta$ is increased, the exposure dose amount $D(d_r)$ is increased.

When the backward scattering coefficient $\eta$ is increased from $\eta_1$ to $\eta_2$, an increased dose amount $\Delta D(d_r)$ is obtained by:

$$\Delta D(d_r) = \frac{1+2\eta_2}{1+2d_r\eta_2} \cdot D(1) - \frac{1+2\eta_1}{1+2d_r\eta_1} \cdot D(1) \qquad \text{(Equation 3)}$$

wherein $\eta_1 \leq \eta_2$.

Equation (3) can be expressed as:

$$\Delta D(d_r) = \frac{2(1-d_r)(\eta_2 - \eta_1)}{(1+2d_r\eta_1)(1+2d_r\eta_2)} \cdot D(1) \qquad \text{[Equation 4]}$$

Thus, a corresponding grating region is exposed to a dose amount by subtracting the increased dose amount $\Delta D$ from the exposure dose amount $D(d_r)$.

Figure 8:
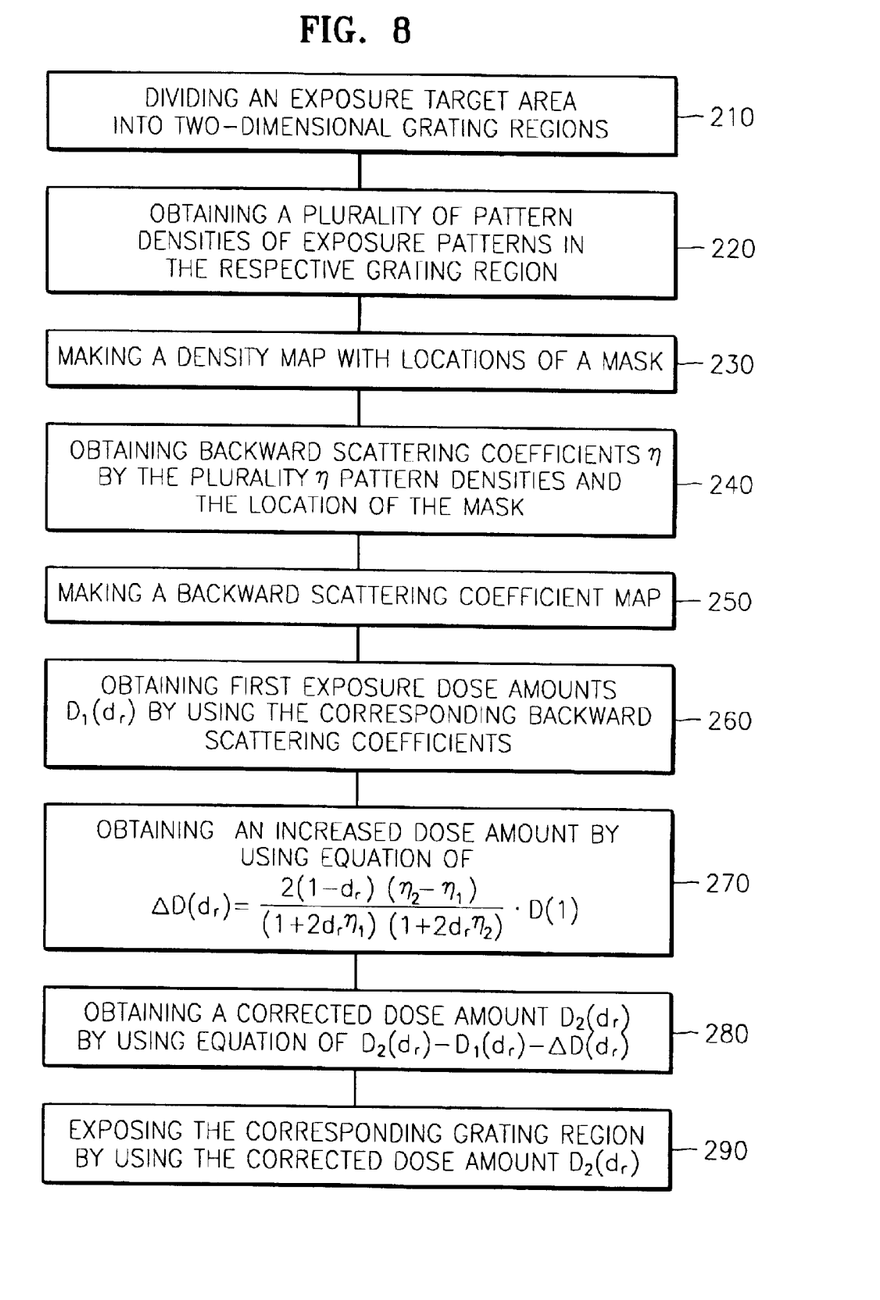
FIG. 8 is a flow chart for illustrating a method of electronic beam exposure according to another embodiment of the present invention.

FIG. 8 is a flow chart for illustrating an electronic beam exposure method according to another embodiment of the present invention.

Referring to FIG. 8, an exposure target area is divided into two-dimensional grating regions (Step 210). Next, a plurality of pattern densities $d_1, d_2, d_3, \ldots, d_n$ of exposure patterns are obtained in the respective grating region (Step 220). A density map is made with the pattern densities $d_1, d_2, d_3, \ldots, d_n$ and locations of a two-dimensional mask expressed as a (x, y) (Step 230). Next, backward scattering coefficients $\eta$ are obtained by the plurality of pattern densities $d_1, d_2, d_3, \ldots, d_n$, preferably, calculated by simulation and the locations of the mask (Step 240). The pattern densities $d_1, d_2, d_3, \ldots, d_n$ and the backward scattering coefficients $\eta$ can be represented as a mathematical equation linearly proportional to each other, for instance, $\eta=f(d(x, y))$, wherein $d(x, y)$ is a pattern density at the location of (x, y) in the mask. That is, backward scattering coefficients $\eta_1, \eta_2, \eta_3, \ldots, \eta_n$ are obtained according to the locations of the mask. Next, a backward scattering coefficient map is made according to locations of the mask for the corresponding backward scattering coefficients $\eta_1, \eta_2, \eta_3, \ldots, \eta_3$ (Step 250). Next, first exposure dose amounts $D_1(d_r)$ such as $D_1(d_1), D_1(d_2), D_1(d_3) \ldots, D_1(d_n)$ are obtained using the corresponding backward scattering coefficients $\eta_1, \eta_2, \eta_3, \ldots, \eta_n$ (Step 260). Here, the first exposure dose amounts $D_1(d_1), D_1(d_2), D_1(d_3) \ldots, D_1(d_n)$ are obtained by Equation (2). Next, the increased dose amount $\Delta D(d_r)$ is obtained at a corresponding grating region by using the Equation (4) (Step 270). Next, a corrected dose amount $D_2(d_r)$ is obtained by subtracting the increased dose amount $\Delta D(d_r)$ from the first exposure dose amount $D_1(d_r)$ (Step 280). Next, the corresponding grating region is exposed by using the corrected dose amount $D_2(d_r)$ (Step 290).

Advantageously, according to embodiments of the present invention, the corrected dose amount $D_2(d_r)$ is obtained by using the variable backward scattering coefficient $\eta$ which is variable with the pattern density and the location of corresponding exposure region. The fogging effect and the loading effect are corrected, and a variation of the line width is properly corrected and uniform CD distribution is obtained independent of the pattern types and the pattern densities.

According to another embodiment of the present invention, the corrected dose amount $D_2(d_r)$ by using the variable backward scattering coefficient can be obtained by using a software module. The software module is preferably a recording medium having stored programs with instructions executable by a computer to perform the electron beam exposure method. The recording medium includes a magnetic recording medium such as a ROM, a floppy disc, a hard disk, and the like, or an optical recoding medium such as a CD-ROM, a DVD, and the like, or another recording medium such as a carrier wave transmitting through internet.

As described above, the illustrative electron beam exposure method according to embodiments of the present invention can be performed by a computer executing program modules. For example, the recording medium of the present invention includes a first program module for obtaining pattern densities in a plurality of grating regions by dividing the exposure surface into a plurality of two-dimensional grating regions, a second program module for obtaining a pattern density map according to exposure locations depending on pattern densities in the grating regions, a third program module for obtaining backward scattering coefficients $\eta$ for the plurality of grating regions based on the each pattern density and exposure location, a fourth program module for making a backward scattering coefficient map according to the exposure location based on the backward scattering coefficients $\eta$, a fifth program module for obtaining a corrected exposure dose amount at the grating region based on the backward scattering coefficient $\eta$ obtained from the backward scattering coefficient map. Thus, the corrected exposure dose amount is obtained by the backward scattering coefficient $\eta$ which is variable with the pattern density and exposure location.

According to an aspect of the present invention, the recording medium is installed in the computer which drives the exposure apparatus and generates the corrected exposure dose amount.

The electron beam exposure method according to embodiments of the present invention performs the proximity effect correction to compensate the fogging effect and the loading effect, obtains the variable backward scattering coefficient η according to the pattern density and location in the grating region, and decides the corrected exposure dose amount. Therefore, an electron beam exposure method of the present invention finely corrects the line width which are varied with the fogging effect and loading effect and obtains uniform CD distribution in a highly integrated semiconductor device manufacturing process.

Although the present invention has been described herein with reference to the accompanying drawings, it is to be understood that the present invention is not limited to those precise embodiments, and various other changes and modifications may be affected therein by one skilled in the art without departing from the scope or spirit. It will be apparent to one of ordinary skill in the art that modifications of the described embodiment may be made without departing from the spirit and scope of the invention. All such changes and modifications are intended to be included within the scope of the invention as defined by the appended claims.

What is claimed is:

1. An electron beam exposure method, comprising the steps of:
    dividing an exposure region into a plurality of grating regions;
    obtaining a pattern density for one of the plurality of grating regions;
    determining a backward scattering coefficient in accordance with the pattern density for the one of the plurality of grating regions;
    calculating an exposure dose amount from the backward scattering coefficient; and
    exposing the one of the plurality of grating regions with the calculated exposure dose amount.

2. The electron beam exposure method of claim 1, wherein the backward scattering coefficient is provided with a variable function proportional to the pattern density.

3. The electron beam exposure method of claim 1, wherein the backward scattering coefficient is provided with a variable value depending on the pattern density and location of the one of the plurality of grating regions.

4. The electron beam exposure method of claim 1, wherein the plurality of grating regions comprise a first grating region having a patterning region having a first backward scattering coefficient and a second grating region having a surrounding region not including the patterning region and a second backward scattering coefficient, wherein the second backward scattering coefficient is higher than the first backward scattering coefficient.

5. An electron beam exposure method, comprising the steps of:
    dividing an exposure region into a plurality of grating regions;
    obtaining respective pattern densities for the plurality of grating regions;
    generating a pattern map with locations of the exposure region in accordance with the pattern densities in the respective plurality of grating regions;
    determining backward scattering coefficients for the plurality of grating regions in accordance with the respective pattern densities and the locations of the exposure region;
    generating a backward scattering coefficient map with the locations of the exposure region in accordance with the backward scattering coefficients;
    calculating an exposure dose amount for the plurality of grating regions in accordance with the backward scattering coefficients obtained from the backward scattering coefficient map; and
    exposing the plurality of grating regions with the calculated exposure dose amount.

6. The electron beam exposure method of claim 5, wherein the backward scattering coefficients are provided with a variable function proportional to the pattern densities.

7. The electron beam exposure method of claim 5, wherein the backward scattering coefficients are provided with variable values depending on the pattern densities and the locations of the grating regions.

8. The electron beam exposure method of claim 5, wherein the plurality of grating regions comprise a first grating region having a patterning region having a first backward scattering coefficient and a second grating region having a surrounding region not including the pattern region and a second backward scattering coefficient, wherein the second backward scattering coefficient is higher than the first backward scattering coefficient of the first grating region.

9. The electron beam exposure method of claim 5, wherein the step of the calculating the exposure dose amount comprises the following equation:

$$D(d_r) = \frac{1+2\eta}{1+2d_r\eta} \cdot D(1)$$

wherein $D(d_r)$ is the exposure dose amount, $\eta$ is the backward scattering coefficient, $d_r$ is a pattern density at a predetermined location, $0 \leq d_r \leq 1$, $D(1)$ is an exposure dose amount having the pattern density of 100%.

10. The electron beam exposure method of claim 5, wherein the step of the calculating the exposure dose amount comprises the steps of:
    calculating an exposure dose amount by following equation:

$$D(d_r) = \frac{1+2\eta}{1+2d_r\eta} \cdot D(1)$$

wherein $D(d_r)$ is the exposure dose amount, $\eta$ is the backward scattering coefficient, $d_r$ is a pattern density at a predetermined location, $0 \leq d_r \leq 1$, $D(1)$ is an exposure dose amount having the pattern density of 100%; and
    obtaining a corrected dose amount by subtracting an increased dose amount $\Delta D(d_r)$ at the predetermined location from the exposure dose amount $D(d_r)$.

11. The electron beam exposure method of claim 10, wherein the increased dose amount $\Delta D(d_r)$ is obtained by a variation of the backward scattering coefficient at the predetermined location of the grating region, when the backward scattering coefficient is increased from $\eta_1$ to $\eta_2$, the increased dose amount $\Delta D(d_r)$ is obtained by following equation:

$$\Delta D(d_r) = \frac{2(1-d_r)(\eta_2 - \eta_1)}{(1+2d_r\eta_1)(1+2d_r\eta_2)} \cdot D(1)$$

wherein $d_r$ is a pattern density at the predetermined location, $0 \leq d_r \leq 1$, $D(1)$ is an exposure dose amount having the pattern density of 100%.

12. A recording medium having stored modules with instructions executable by a computer to perform a corrected electron beam exposure, the recording medium comprising:

a first program module for obtaining a pattern density in one grating region produced by dividing an exposure surface into a plurality of grating regions;

a second program module for obtaining a backward scattering coefficient η at the one grating region in accordance with the pattern density; and a third program module for obtaining an exposure dose amount from the backward scattering coefficient.

13. The recording medium of claim 12, wherein the second program module comprises a sub-program module for deciding the backward scattering coefficient η in accordance with a predetermined function in which the backward scattering coefficient η is proportional to the pattern density.

14. The recording medium of claim 12, wherein the second program module comprises a sub-program module for deciding the backward scattering coefficient η, the backward scattering coefficient η is variable in accordance with the pattern density and a location of the grating region.

15. The recording medium of claim 12, wherein the plurality of grating regions comprises a first grating region having a patterning region having a first backward scattering coefficient and a second grating region having a surrounding region not including the patterning region having a second backward scattering coefficient, the second program module comprises a sub-program module in which the second backward scattering coefficient is higher than the first backward scattering coefficient.

16. A recording medium having stored programs executable by a computer for performing a corrected electron beam exposure, the recording medium comprising:

a first program module for obtaining pattern densities of a plurality of grating regions produced by dividing an exposure region;

a second program module for obtaining a pattern density map with locations of the plurality of grating regions in accordance with the pattern densities;

a third program module for obtaining backward scattering coefficients at the plurality of grating regions in accordance with the pattern densities and the locations of the exposure region;

a fourth program module for generating a backward scattering coefficient map in accordance with the backward scattering coefficients; and a fifth program module for obtaining a corrected exposure dose amount at one of the plurality of grating regions in accordance with the backward scattering coefficients.

17. The recording medium of claim 16, wherein the third program module comprises a sub-program module in which the backward scattering coefficients are provided with a variable function proportional to the pattern densities.

18. The recording medium of claim 16, wherein the third program module comprises a sub-program module in which the backward scattering coefficients are provided with a variable value depending on the pattern densities and the location of the grating region.

19. The recording medium of claim 16, wherein the plurality of grating regions comprises a first grating region having a patterning region having a first backward scattering coefficient and a second grating region having a surrounding region not including the patterning region and a second backward scattering coefficient, wherein the second program module comprises a sub-program module in which the first backward scattering coefficient is higher than the second backward scattering coefficient.

20. The recording medium of claim 16, wherein the fifth program module comprises a sub-program module for calculating an exposure dose amount by following equation:

$$D(d_r) = \frac{1+2\eta}{1+2d_r\eta} \cdot D(1)$$

wherein $D(d_r)$ is the exposure dose amount, $\eta$ is the backward scattering coefficient, $d_r$ is a pattern density at a predetermined location, $0 \leq d_r 1$, $\leq D(1)$ is an exposure dose amount having the pattern density of 100%.

21. The recording medium of claim 16, wherein the fifth program module comprises:

a first sub-program module for calculating an exposure dose amount by following equation:

$$D(d_r) = \frac{1+2\eta}{1+2d_r\eta} \cdot D(1)$$

wherein $D(d_r)$ is the exposure dose amount, $\eta$ is the backward scattering coefficient, $d_r$ is a pattern density at a predetermined location, $0 \leq d_r \leq 1$, $D(1)$ is an exposure dose amount having the pattern density of 100%; and a second sub-program module for obtaining a corrected dose amount by subtracting an increased dose amount $\Delta D(d_r)$ at a predetermined location from the exposure dose amount $D(d_r)$.

22. The recording medium of claim 21, wherein the increased dose amount $\Delta D(d_r)$ is obtained by a variation of the backward scattering coefficient at a predetermined location of the grating region, when the backward scattering coefficient is increased from $\eta_1$ to $\eta_2$, the increased dose amount $\Delta D(d_r)$ is obtained by following equation:

$$\Delta D(d_r) = \frac{2(1-d_r)(\eta_2 - \eta_1)}{(1+2d_r\eta_1)(1+2d_r\eta_2)} \cdot D(1)$$

wherein $d_r$ is a pattern density at the predetermined location, $0 \leq d_r \leq 1$, $D(1)$ is an exposure dose amount having the pattern density of 100%.

* * * * *